United States Patent
Spencer et al.

(10) Patent No.: US 6,405,352 B1
(45) Date of Patent: Jun. 11, 2002

(54) METHOD AND SYSTEM FOR ANALYZING WIRE-ONLY CHANGES TO A MICROPROCESSOR DESIGN USING DELTA MODEL

(75) Inventors: Alexander Koos Spencer, Austin; Barry Duane Williamson, Round Rock, both of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/343,448

(22) Filed: Jun. 30, 1999

(51) Int. Cl.[7] .............................................. G06F 17/50
(52) U.S. Cl. ............................................................ 716/6
(58) Field of Search ................................. 326/41; 716/2, 716/4–6, 13

(56) References Cited

U.S. PATENT DOCUMENTS 5,861,761 A * 1/1999 Kean ............................ 326/41

* cited by examiner

Primary Examiner—Matthew Smith
Assistant Examiner—Thuan Do
(74) Attorney, Agent, or Firm—Duke W. Yee; Mark E. McBurney

(57) ABSTRACT

A method for analyzing a design or a model of a microprocessor chip model is provided. A base chip model is generated, and it is modified with wire-only changes to produce a modified chip model. The modified chip model is compared to the base chip model to discern the wire-only changes to form a delta chip model. A set of values for RC delays and net capacitance based on the delta chip model is produced, and the modified chip model is timed using the set of values for RC delays and net capacitance on the delta chip model and RC delays and net capacitance on the base chip model.

15 Claims, 6 Drawing Sheets

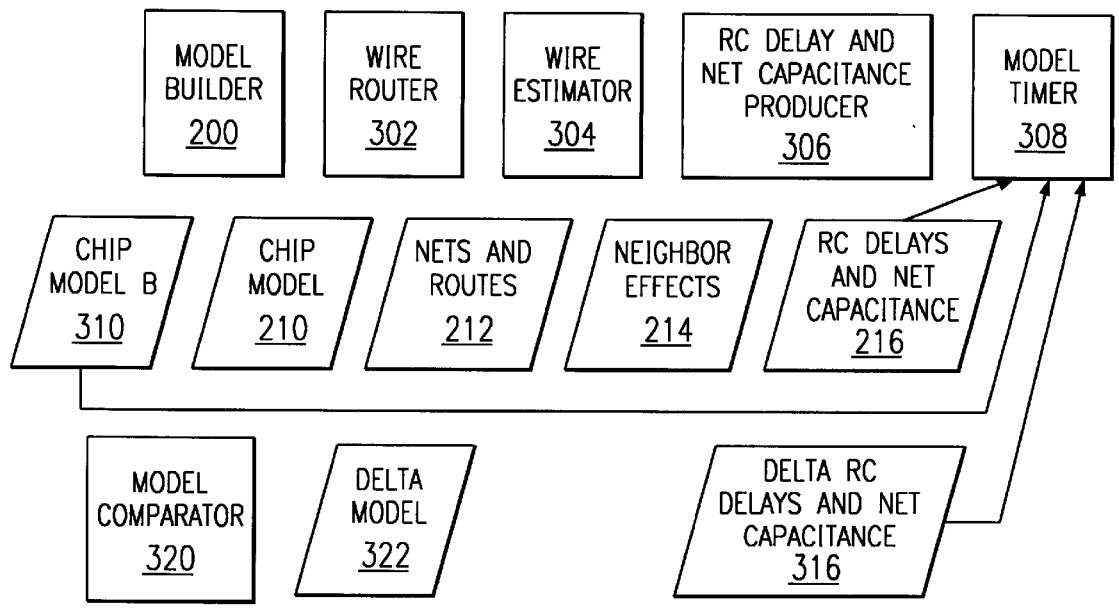
FIG. 3F
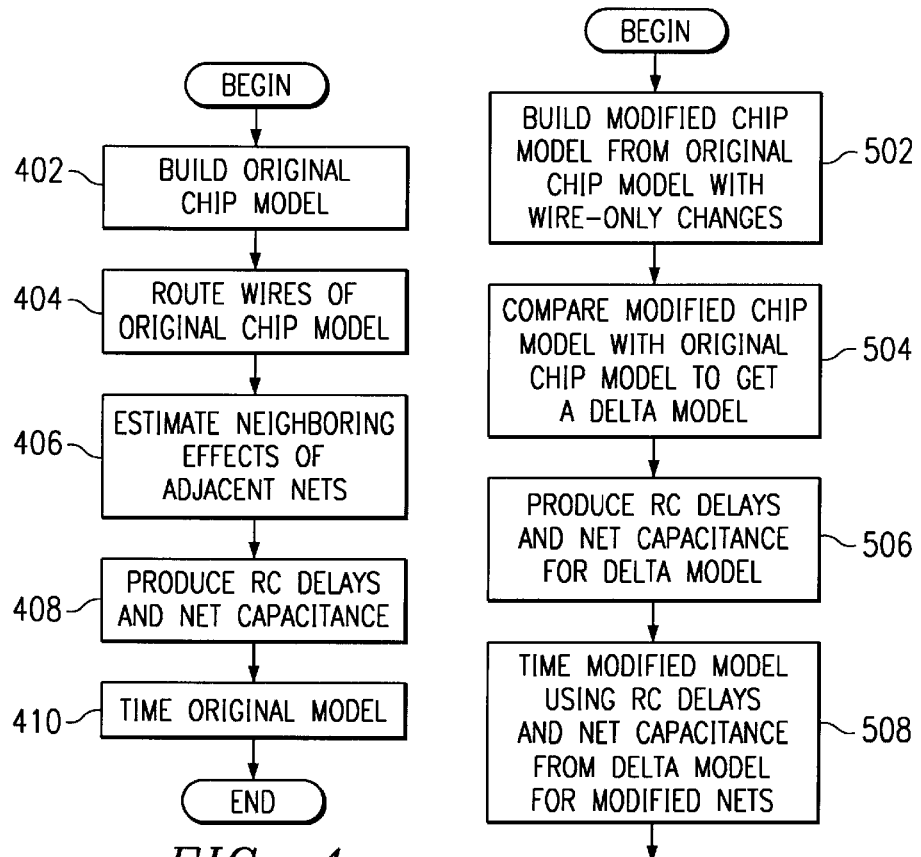
FIG. 4
(PRIOR ART)
FIG. 5

METHOD AND SYSTEM FOR ANALYZING WIRE-ONLY CHANGES TO A MICROPROCESSOR DESIGN USING DELTA MODEL

BACKGROUND OF THE INVENTION

1. Technical Field

The present invention relates to an improved data processing system and, in particular, to a method and apparatus for optimizing performance in a data processing system. Still more particularly, the present invention provides a method and apparatus for enhancing performance of a design process for a microprocessor.

2. Description of Related Art

Microprocessor designs are becoming more complex, and marketing pressures are reducing the amount of time available to bring new, complex chips to market. These types of progressive changes require new methodologies and tools to develop high speed microprocessors.

One manner of gaining significant efficiencies is to employ a two-phase schedule for getting a microprocessor chip into fabrication. During phase A, information relating to the actual transistors and wiring used in the design are processed in its entirety, whereas during phase B, only wire changes from the phase A are processed. Using this methodology, the fabrication process can be started once phase A data has been processed. In the meantime, wire-only changes can still be in progress during phase B so that improvements in the performance of the microprocessor design can continue to be made. However, in order to analyze the current performance (i.e. frequency) of the chip design using current methods, a timing run of the full chip design model is made. Due to the amount of data to be processed for analysis and the number of steps required to produce the data, a timing run with a full chip design model is usually a time-intensive process.

Therefore, it would be particularly advantageous to provide the ability to shorten the design latency for wire-only changes to a chip in order to allow for more numerous wire-only design iterations during the phase B duration.

SUMMARY OF THE INVENTION

A method for analyzing a design or a model of a microprocessor chip model is provided. A base chip model is generated, and it is modified with wire-only changes to produce a modified chip model. The modified chip model is compared to the base chip model to discern the wire-only changes to form a delta chip model. A set of values for RC delays and net capacitance based on the delta chip model is produced, and the modified chip model is timed using the set of values for RC delays and net capacitance on the delta chip model and RC delays and net capacitance on the base chip model, where any net that is represented in both models, the delta chip model's data prevails.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIGS. 3A–3F depict a process of timing a modified model containing wire-only changes over a base model;

FIG. 4 is a flowchart depicting the prior art method of generating a timing run of a chip design; and FIG. 5 is a flowchart depicting the method of generating a timing run of a chip design with wire-only changes using a model comparator.

DETAILED DESCRIPTION OF THE PREFERRED EMBODIMENT

Figure 1:
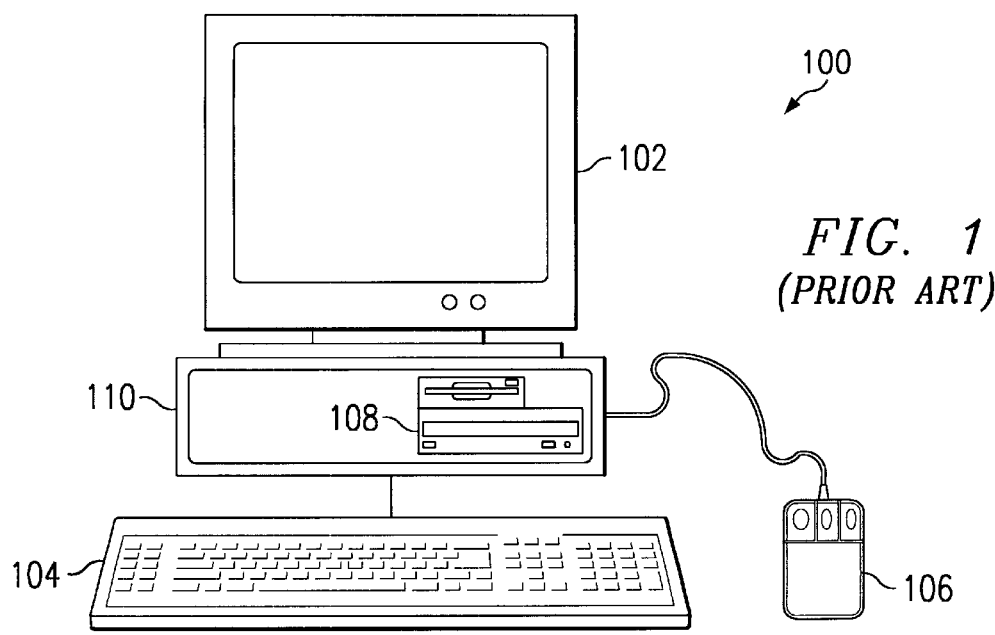
FIG. 1 depicts a data processing system in which the present invention may be implemented.

With reference now to FIG. 1, a pictorial representation depicts a data processing system in which the present invention may be implemented. A personal computer 100 is depicted which includes a system unit 110, a video display terminal 102, a keyboard 104, storage devices 108, which may include floppy drives and other types of permanent and removable storage media, and mouse 106. Additional input devices may be included with personal computer 100. Computer 100 can be implemented using any suitable computer. Although the depicted representation shows a personal computer, other embodiments of the present invention may be implemented in other types of data processing systems, such as mainframes, servers, workstations, network computers, Internet appliances, palm computers, etc. System unit 110 comprises memory, a central processing unit (CPU), I/O unit, etc. However, in the present invention, system unit 110 contains a speculative processor, either as the central processing unit or as one of multiple CPUs present in the system unit.

The present invention is a methodology for handling wire-only changes made to a chip design, such as that for a microprocessor chip. Since most of the base (or original) design model does not change, time is saved by processing only the changes, or deltas, from the previous design. The remainder of the data that is generated during an evaluation of the base model is saved and can be reused as input into the timing evaluation process.

Since the wiring data from the original timing run can be mostly preserved when the delta wiring changes are rewired, processing only the changes between two designs produces a more stable design point by not having to rewire the entire chip. When the entire chip design is rerun, different solutions may be obtained for all of the nets, which could introduce timing problems on nets that were not changed. By using a delta chip model, the majority of the nets remain unchanged, thereby enabling a chip manufacturer to converge on a timing objective for a chip design more quickly.

The methodology of the present invention provides analytical data on the performance characteristics of the chip more efficiently. The present invention significantly reduces the turnaround time required to produce timing information for a chip design model when a wire-only change is made. Using previous chip design methodologies, once the phase A data is released, the design process usually goes into a manual mode for handling phase B (wire-only) changes. Once a wire-only design change is made to the model, the affected nets are manipulated by manually editing them via a tool which can edit the wiring data. This is a tedious process in which a single individual makes the changes, since only one person can edit the model at any given instance. Due to the number of changes that might be required for a phase B design, this updating processing can take up to several weeks to complete. Hence, one goal of the present invention is to reduce the time to produce analytical data after a wire-only change is made to a processor design and to remove the dependency on the manual edit process.

Currently, the steps required to produce a chip timing run are the following: (1) build the model; (2) route the wires; (3) wire estimator; (4) produce the wire information including capacitance and RC delays; and (5) time the model. These steps are described in more detail with respect to FIGS. 2A–2I.

Figure 2A:
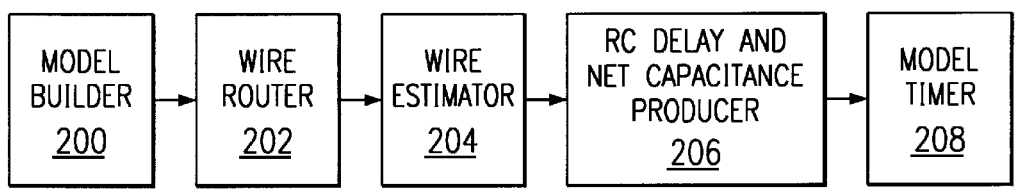
FIGS. 2A–2I are prior art figures depicting the manner in which a timing run for a chip design is produced.

With reference now to FIGS. 2A–2I, a set of prior art figures depict the manner in which a timing run for a chip design is produced. Similar reference numerals in the figures refer to similar elements herein described. FIG. 2A shows a set of five units that accept inputs from previous stages, complete some type of processing related to generating data for the timing run of a chip design, and output that data: model builder 200, wire router 202, wire estimator 204, RC delay and net capacitance producer 206, and model timer 208.

Figure 2B:
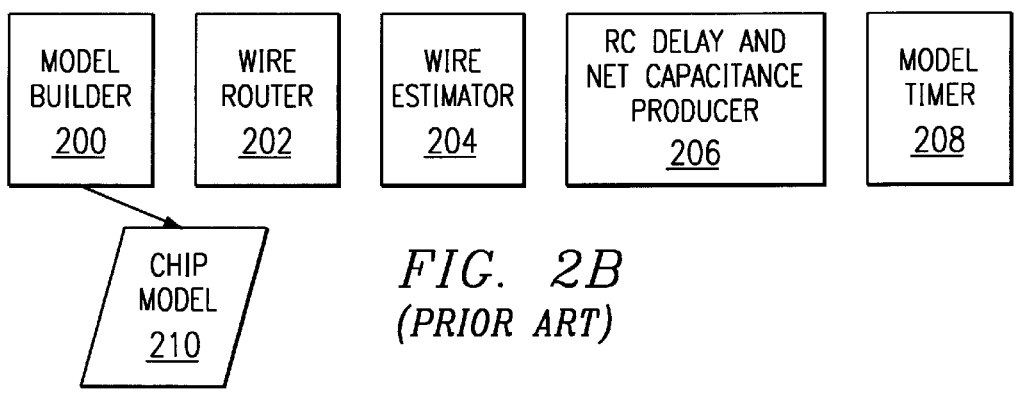

FIG. 2B shows model builder 200 outputting base chip design 210 (original chip model). In the model builder tool (or alternatively, set of tools), all of the designs from the units that comprise a chip design are assembled together to create the chip model, which provides detailed information regarding the logic blocks and their interconnect. The chip model also has information such as power levels for the logic blocks, which yield information as to the size of the transistors, the net names and net attributes contained in the design, and the location that the block occupies on the chip.

Figure 2C:
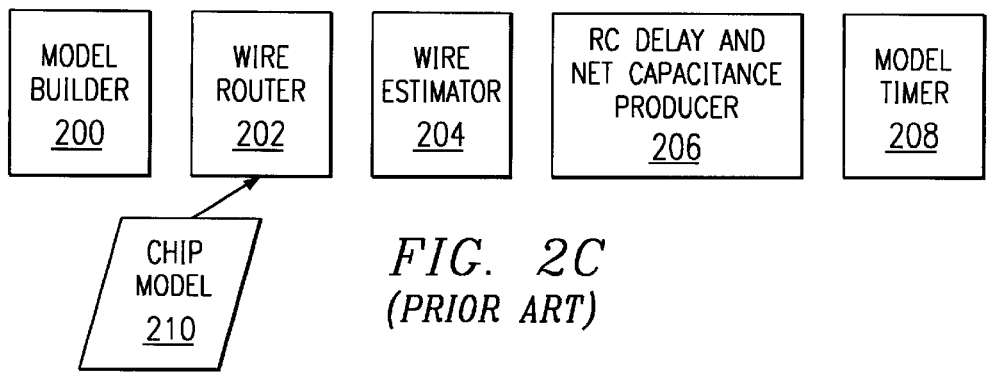
Figure 2D:
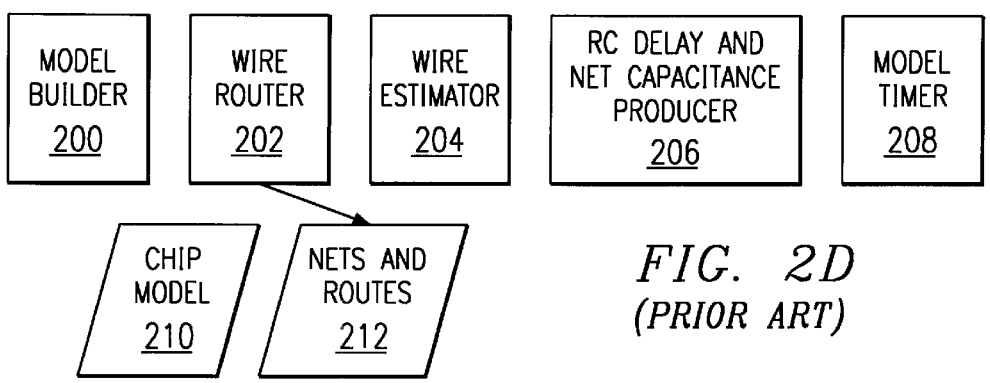

FIG. 2C shows wire router 202 reading base chip model 210 as input. The chip contains several metal layers, each having several wiring tracks, between which wires may be routed so that they will not 'short' to one another. The wiring tool goes through the interconnect of the model and routes all of the nets in the chip to a unique wiring solution using the wiring planes and tracks available. No two nets may occupy the same space. It produces a file of all of the nets and their routes that it found, such as nets and routes file 212, as shown in FIG. 2D.

Figure 2E:
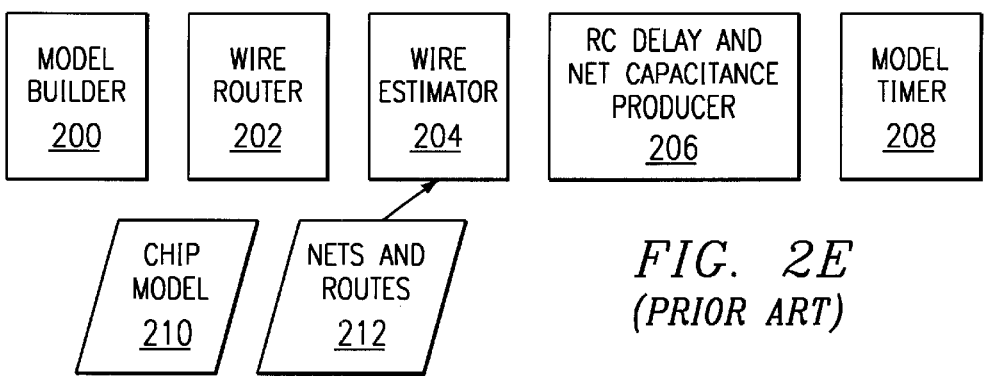
Figure 2F:
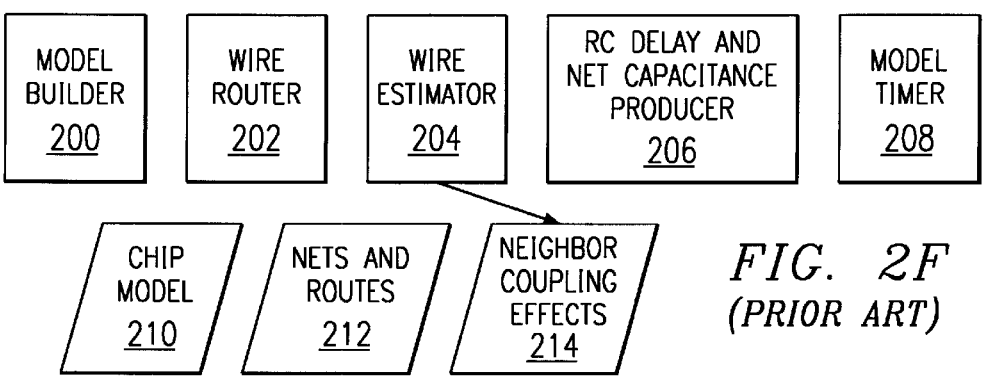

FIG. 2E shows wire estimator 204 inputting the nets and routes file 212 in order to produce information about the wire routes and neighboring coupling effects of adjacent nets for each net in the design, such as neighbor coupling effects 214 shown in FIG. 2F. With the frequencies of current processors getting faster with each generation, the wire delays are becoming more critical to the design. Estimates that were done on previous processors are no longer useful or accurate enough because of shrinking geometries.

For example, previous processor designs would have an initial analysis that assumed information about chip wiring without actually running the wiring tool. It would assume the length of the wire to be the minimum distance and then add a percentage (i.e. 10%) to cover any jogs in the wire that the final wiring tool would have to make due to congestion and conflicts with other wires. In reality, this assumption had a negative impact on the design schedule as it drove designers to fix nets that were not really critical to the design. Instead of focusing on the true critical nets, time was wasted on implementing fixes for non-critical nets.

Previous estimation methods also assumed that every adjacent wiring track was occupied and with today's technologies, the coupling capacitance is becoming a much larger percentage of the total net capacitance because of the shrinking geometries. Thus, knowing the actual neighbors is very important in computing the correct net capacitance.

Figure 2G:
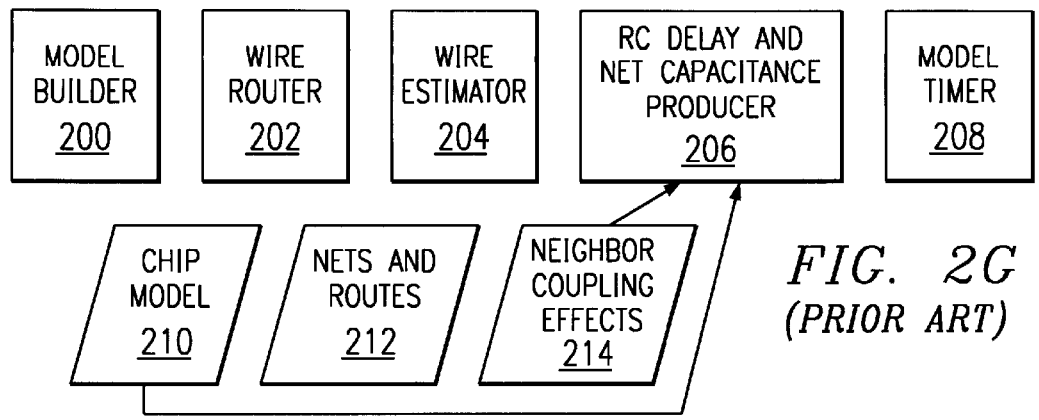
Figure 2H:
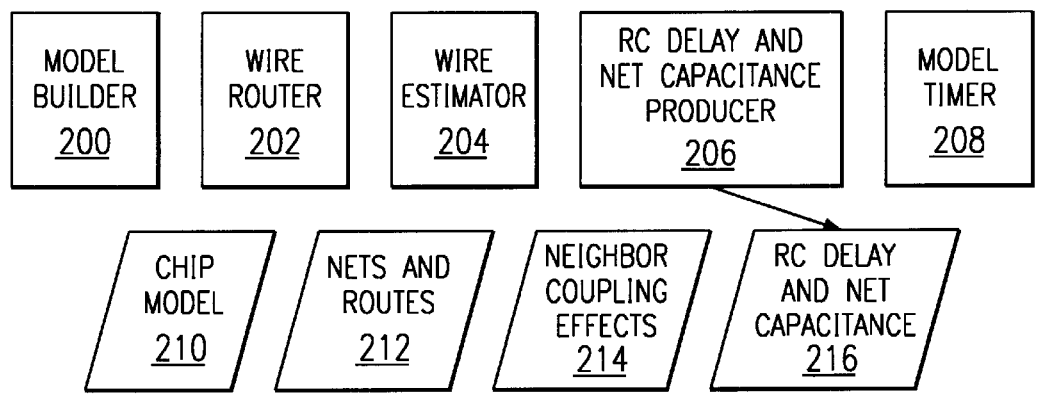

FIG. 2G shows RC Delay and Net Capacitance Producer 206 inputting neighbor coupling effects 214 and chip model 210. This tool uses the information provided by the wire estimator along with the chip model to produce net capacitance and RC delay information 216, as shown in FIG. 2H, for each net in the design by combining the wiring information with the pin capacitances of all of the sinks for each net. This information is then passed on to the chip timing tool to calculate the frequency of the chip.

Figure 2I:
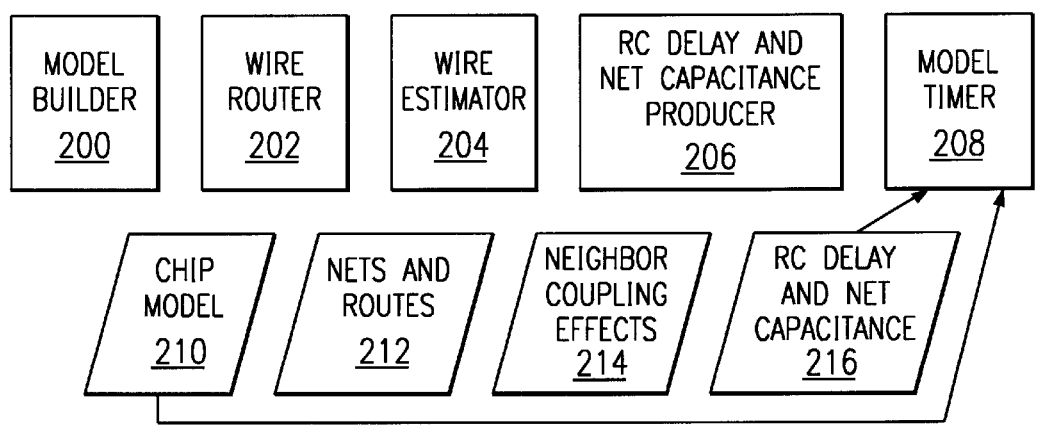

FIG. 2I shows model timer 208 inputting net capacitance and RC delay information 216 and chip model 210. This tool produces the analytical data that can be examined to determine the frequency of the chip and areas that do not meet the target that must be improved.

The data files and data structures used to pass information between the design tools and software packages are configured to the formats expected or required by each tool or module, as each of the tools 200–208 may be commercially available.

The present invention relies on the prior art method of providing an initial, complete timing run. However, a wire-only change does not cause the entire model to be rerun in the present invention, as was the case in the prior art.

Figure 3A:
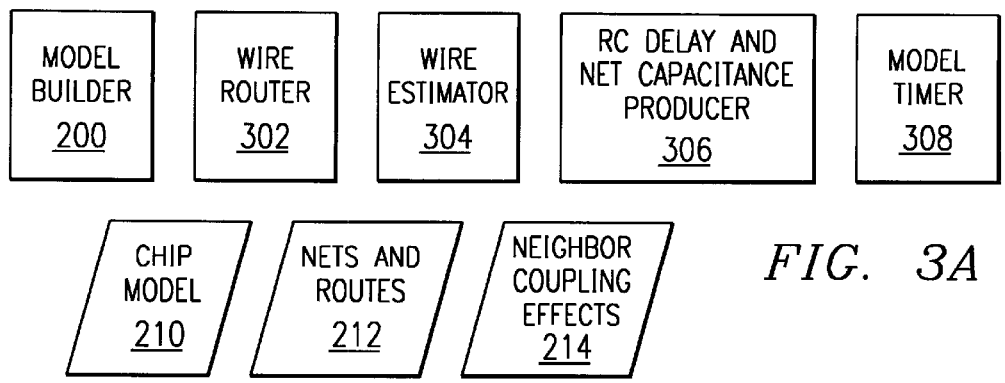

With reference now to FIGS. 3A–3F, a process of timing a modified model containing wire-only changes from a base model is depicted. Similar reference numerals in FIG. 2, which described the prior art, and FIGS. 3A–3F refer to similar modules or data. Hence, the same model builder may be used in the present invention. FIG. 3A shows the various design tools with output information that has been saved from a previous full timing run of the base chip model. Alternatively, the functionality shown in the various tools may be provided in a single tool.

Figure 3B:
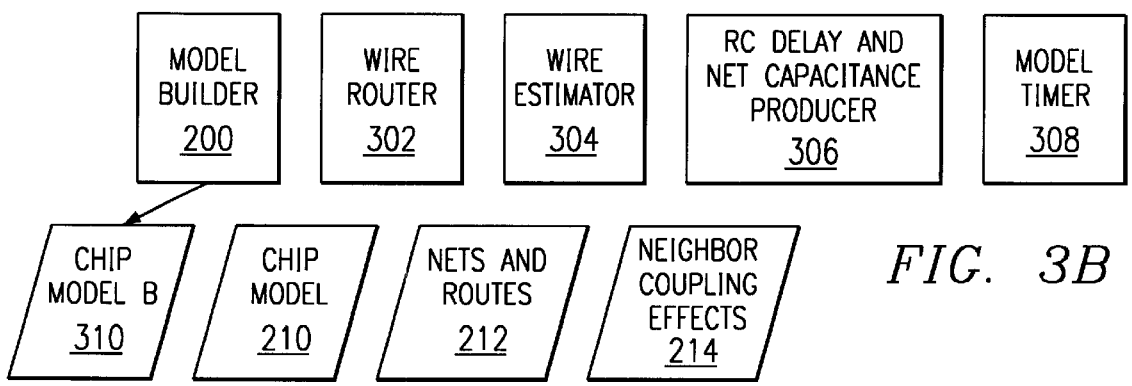

FIG. 3B shows that model builder 200 is employed to make changes to the original or base model. The transistor information of the base model does not change, but the interconnect between transistors or the metal layer through which the wires run might be modified, so the model is rebuilt as a modified model.

At this point, there are two ways to proceed depending on the accuracy desired to analyze the impact of the wire changes to the design. In the first method, the wire changes can be estimated by assuming information about the global wiring and the neighbor coupling effects of adjacent wires to the modified nets, which effectively skips the need for processing by a wire router or a wire estimator. This method is depicted in FIGS. 3D–3E.

In the second method, the entire chip can be rerouted so that the effects of adjacent wires can be more accurately modeled, which effectively includes processing by a wire router and a wire estimator. The largest gain in efficiency is obtained by skipping the processing of the wire router and the wire estimator, although there is still a time savings even if these tools are run. Again, one of the objects of the present invention is to determine if the wire changes will adversely affect the chip performance, and since this is a delta change in wiring in which only a small subset of the design changes, skipping the processing of the wire router and the wire estimator provides some valuable data. When designing a high performance microprocessor, the timing iteration loop is typically repeated several times: several times using the quickest but least accurate analysis; several times using a more stringent estimation process that is a little more time consuming; and the final run which analyzes the actual coupling/noise effects of adjacent wires. Whether or not the processing of the wire router and the wire estimator is skipped, the present invention still provides significant time improvements on the chip design process.

Figure 3C:
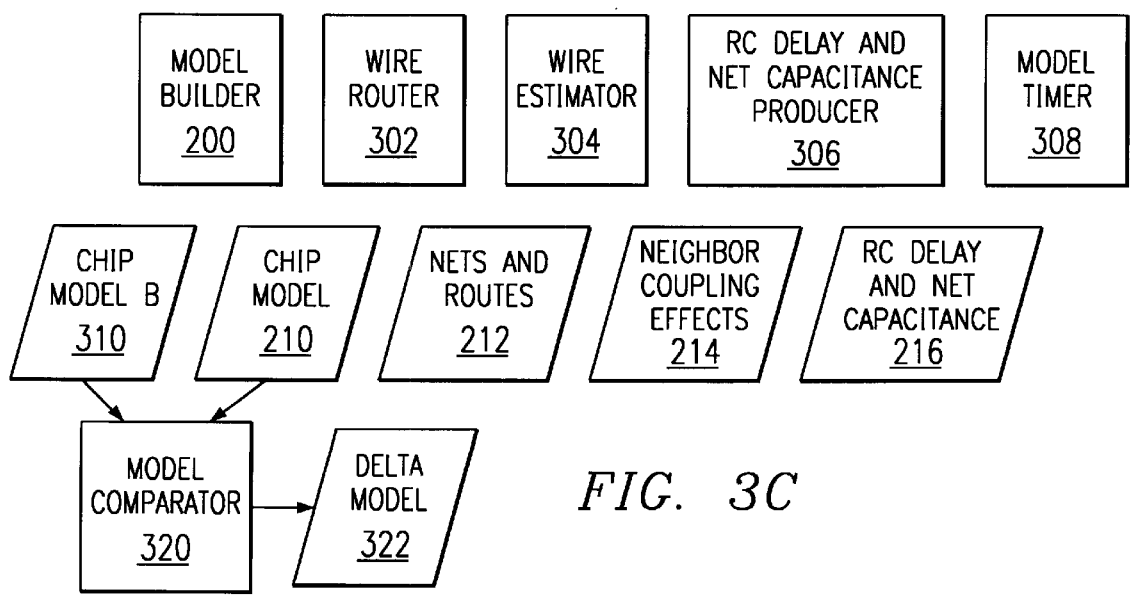
Figure 3D:
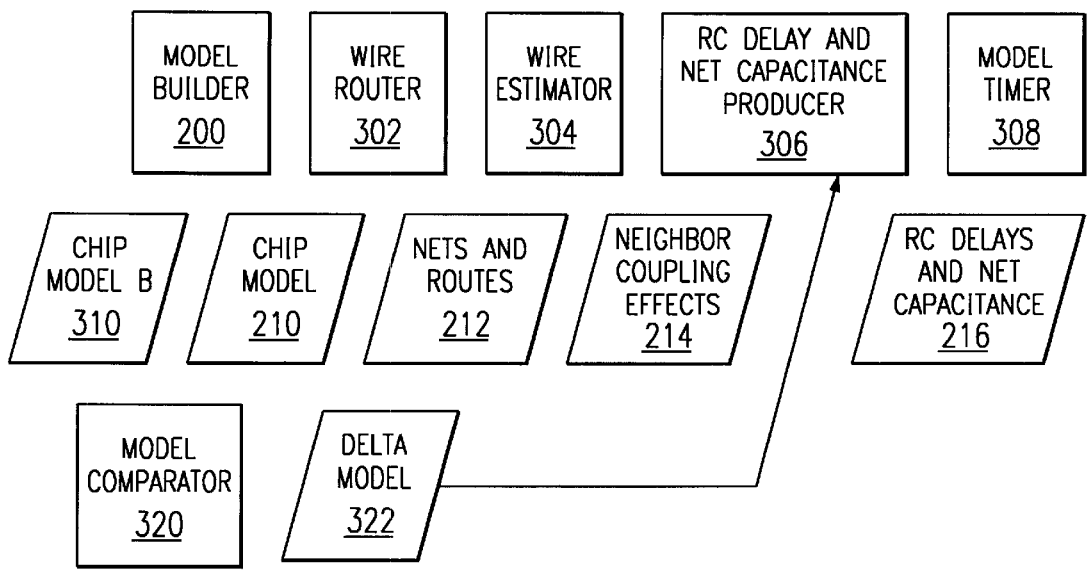
Figure 3E:
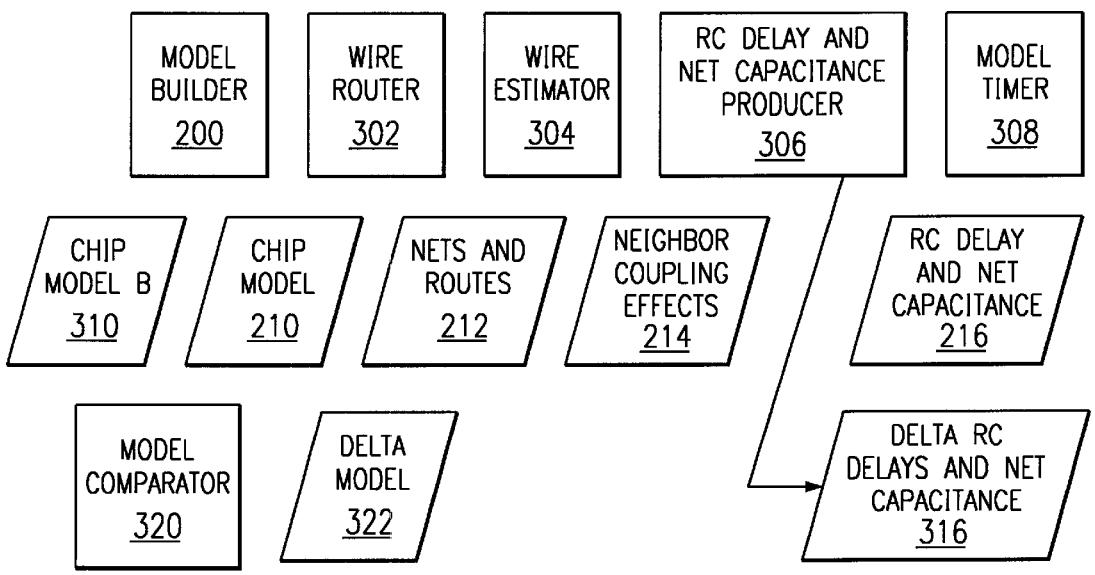

FIG. 3C depicts the use of a model comparator 320 that accepts the base model and the modified model as inputs and generates delta model 322 as an output. Once the modified model containing the wire changes is built, the model comparator program compares the two designs and finds the wires (nets) that have changed.

The original timing run produced the RC delay and net capacitance information 216 for the entire chip. RC delay and net capacitance producer 306 can be rerun on delta model 322 as shown in FIG. 3D, to produce new delta RC delay and net capacitance information 316 for these wires, as shown in FIG. 3E.

FIG. 3F shows that both sets of data from the RC delay and net capacitance producer 306 can be used by model timer 308. As model timer 308 generates a timing run for the modified model, model timer 308 reads most of the delay and capacitance information from RC delays and net capacitance information 216 for the majority of the modified model. For those nets that have been changed, model timer 308 reads the delay and capacitance information from RC delays and net capacitance information 316 with the new delta changes taking priority over the same nets found in original files.

With reference now to FIG. 4, a flowchart depicts the prior art method of generating a timing run of a chip design. The steps shown in FIG. 4 condense the description of the generation of a timing run provided above with respect to FIG. 2. The process begins by building an original chip model (step 402). A wire router then routes the wires of the original chip design (step 404). A wire estimator then estimates neighboring effects of adjacent nets (step 406). Another tool produces RC delays and net capacitance values for the base model (step 408). A model timer then uses the delay and capacitance information with the base model to generate a timing run for analysis (step 410). The process is then complete, although there may be some post-processing performed by other software packages or tools.

With reference now to FIG. 5, a flowchart depicts the method of generating a timing run of a chip design with wire-only changes using a model comparator. The steps shown in FIG. 5 condense the description of the generation of a timing run provided above with respect to FIG. 3.

The process begins with a modified chip model being built from an original model with wire-only changes (502). The modified chip model and the original chip model are then compared to get a delta model (step 504). Another tool produces RC delays and net capacitance values for the modified model (step 506). A model timer then uses the delay and capacitance information (for both the original model and modified model) with the modified model to generate a timing run for analysis (step 508). The process is then complete, although there may be some post-processing performed by other software packages or tools.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media such a floppy disc, a hard disk drive, a RAM, and CD-ROMs and transmission-type media such as digital and analog communications links.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for analyzing a chip model, the method comprising the computer-implemented steps of:

generating a base chip model;

modifying the base chip model with wire-only changes to produce a modified chip model; and comparing the modified chip model to the base chip model to discern the wire-only changes as a delta chip model.

2. The method of claim 1 further comprising:

producing a set of values for RC delays and net capacitance based on the delta chip model.

3. The method of claim 1 further comprising:

timing the modified chip model using the set of values for RC delays and net capacitance on the delta chip model and RC delays and net capacitance on the base chip model.

4. The method of claim 1 further comprising:

executing a wire estimator using the delta chip model.

5. The method of claim 1 further comprising:

executing a wire router using the delta chip model.

6. A data processing system for analyzing a chip model, the data processing system comprising:

generating means for generating a base chip model;

modifying means for modifying the base chip model with wire-only changes to produce a modified chip model; and comparing means for comparing the modified chip model to the base chip model to discern the wire-only changes as a delta chip model.

7. The data processing system of claim 6 further comprising:

producing means for producing a set of values for RC delays and net capacitance based on the delta chip model.

8. The data processing system of claim 6 further comprising:

timing means for timing the modified chip model using the set of values for RC delays and net capacitance on the delta chip model and RC delays and net capacitance on the base chip model.

9. The data processing system of claim 6 further comprising:

executing means for executing a wire estimator using the delta chip model.

10. The data processing system of claim 6 further comprising:

executing means for executing a wire router using the delta chip model.

11. A computer program product in a computer-readable medium for use in a data processing system for analyzing a chip model, the computer program product comprising:

first instructions for generating a base chip model;

second instructions for modifying the base chip model with wire-only changes to produce a modified chip model; and third instructions for comparing the modified chip model to the base chip model to discern the wire-only changes as a delta chip model.

12. The computer program product of claim 11 further comprising:
   instructions for producing a set of values for RC delays and net capacitance based on the delta chip model.

13. The computer program product of claim 11 further comprising:
   instructions for timing the modified chip model using the set of values for RC delays and net capacitance on the delta chip model and RC delays and net capacitance on the base chip model.

14. The computer program product of claim 11 further comprising:
   instructions for executing a wire estimator using the delta chip model.

15. The computer program product of claim 11 further comprising:
   instructions for executing a wire router using the delta chip model.

* * * * *